(12) United States Patent
Banerjee

(10) Patent No.: US 6,528,865 B1
(45) Date of Patent: Mar. 4, 2003

(54) THIN AMORPHOUS FLUOROCARBON FILMS

(75) Inventor: Indrajit Banerjee, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/235,216

(22) Filed: Jan. 22, 1999

(51) Int. Cl.[7] ............... H01L 23/58; H01L 23/48
(52) U.S. Cl. ....................... 257/642; 257/759
(58) Field of Search ................. 257/635, 637, 257/642, 643, 758, 759; 438/623, 725

(56) References Cited

U.S. PATENT DOCUMENTS

| | | | | |
|---|---|---|---|---|
| 5,569,501 A | | 10/1996 | Bailey et al. ............... | 427/577 |
| 5,872,402 A | * | 2/1999 | Hasegawa ................... | 257/758 |
| 5,937,323 A | * | 8/1999 | Orczyk et al. .............. | 438/624 |
| 6,071,597 A | * | 6/2000 | Yang et al. ................. | 428/209 |
| 6,218,299 B1 | * | 4/2001 | Akahori et al. ............. | 438/682 |

FOREIGN PATENT DOCUMENTS

JP          9-213796       *  8/1997

* cited by examiner

*Primary Examiner*—Tom Thomas
*Assistant Examiner*—Hung Kim Vu
(74) *Attorney, Agent, or Firm*—Blakely, Sokoloff, Taylor & Zafman LLP

(57) ABSTRACT

An amorphous fluorocarbon material useful as a thin film low-k dielectric layer is disclosed. This film is deposited in a high density plasma reactor, preferably an electron cyclotron resonance reactor, using helium as the plasma gas. Substituting helium for argon as the plasma gas results in the thin film layer having a number of desirable qualities, including a high hardness, a high modulus, and high thermal stability. These qualities make the film especially useful as an interlayer dielectric material in integrated circuit manufacturing.

8 Claims, 8 Drawing Sheets

THIN AMORPHOUS FLUOROCARBON FILMS

FIELD OF THE INVENTION

The present invention relates to the field of thin film materials. More specifically, the invention relates to a way of depositing a thin film layer in a manner that results in the layer having desirable qualities.

BACKGROUND OF THE INVENTION

The integrated circuits manufactured today typically consist of millions of devices, such as transistors, capacitors, and resistors, formed on a semiconductor substrate. Complex interconnect layers are used to connect these individual devices together in order to form the desired circuits. The quality of these interconnect layers significantly affects the performance and reliability of the fabricated integrated circuits. An interconnect layer typically includes numerous metal lines, spaced a distance apart from one another, which interconnect the devices on the semiconductor substrate. These metal lines are insulated from one another by filling the space between the adjacent lines with a dielectric material.

Manufacturers have greatly improved integrated circuit performance and yield by increasing device density and by shrinking, to the submicron level, the distances between devices fabricated on a semiconductor substrate and also the distances between the metal lines that interconnect these devices. Integrated circuit functionality is improved by connecting the devices using multiple interconnect layers stacked on top of one another. Unfortunately, as the distance between the metal interconnect lines has decreased, capacitance has increased. This is because capacitance is inversely proportional to the distance between the metal lines.

High capacitance results in problems such as increased crosstalk, increased RC delay, and increased power dissipation between metal interconnect lines. These problems may adversely affect integrated circuit performance. To prevent these interconnect problems, manufacturers of integrated circuits reduce capacitance by using low dielectric constant materials to electrically insulate devices and their interconnecting metal lines. The capacitance of the metal lines is directly proportional to the dielectric constant of the dielectric material between the metal lines. Therefore, lowering the dielectric constant of the dielectric material results in a corresponding reduction in capacitance.

To provide intralayer electrical insulation, a layer of dielectric material is deposited on each interconnect layer to fill the gaps between metal lines. When interconnect layers are stacked on top of one another, an additional layer of dielectric material may be used to provide interlayer insulation of each interconnect layer from the interconnect layers above and below it. If it has the right properties, a single layer of dielectric material can be used for both intralayer and interlayer insulation.

Alternatively, a layer of dielectric material could be deposited first. Trenches and vias can be etched into the dielectric layer and filled with a metal, such as copper, for example, to form a metal interconnect layer. Vias are vertical openings filled with a conducting material used to connect various stacked interconnect layers to one another. In forming the metal interconnect layer in this manner, the dielectric material provides intralayer insulation between the interconnect metal lines. An additional layer of dielectric material is deposited on the interconnect layer to provide interlayer insulation from the interconnect layer above it. If it has the right properties, this additional layer of dielectric material can comprise the same material as the layer of dielectric material below it.

In addition to their insulating properties, it is desirable for interlayer dielectric (ILD) materials to have a number of other properties. An ILD should have a high hardness so that it will be able to withstand chemical-mechanical planarization. An ILD should have a high modulus, or stiffness, so that it has the structural strength to support additional layers deposited on top of it. High hardness and modulus values also allow for via formation through the ILD between adjacent interconnect layers. It is also desirable that an ILD material be thermally stable so that it does not degrade or release harmful substances during subsequent high temperature processing steps during manufacturing.

Silicon dioxide ($SiO_2$) has been the most commonly used ILD in semiconductor manufacturing. $SiO_2$ is thermally stable and has a high hardness, a high modulus, and a dielectric constant (k) of approximately 4. Dielectric constants are determined for various materials based on a scale where 1 represents the dielectric constant of a vacuum. Although $SiO_2$ has a number of desirable properties that make it readily adaptable to the manufacturing environment, its relatively high dielectric constant has limited the ability of integrated circuit manufacturers to further increase device density and decrease the distances between the interconnect lines. There exists a need for a low-k ILD material with a dielectric constant less than that of $SiO_2$, a high hardness, a high modulus, and a high thermal stability.

SUMMARY OF THE INVENTION

Briefly, an amorphous fluorocarbon ($C_xF_y$) material layer is described. This material layer has a number of desirable qualities, including a high hardness, a high modulus, and high thermal stability. These qualities make the material layer especially useful as an interlayer low-k dielectric material in integrated circuit manufacturing.

In a further aspect of the present invention, a method of depositing a thermally stable, mechanically hard, and elastic dielectric material layer is described. The dielectric material layer is deposited using a plasma reactor. Helium is used as the plasma gas. The use of helium results in a dielectric material layer with a high hardness, a high modulus, and a high thermal stability.

DETAILED DESCRIPTION

Figure 1:
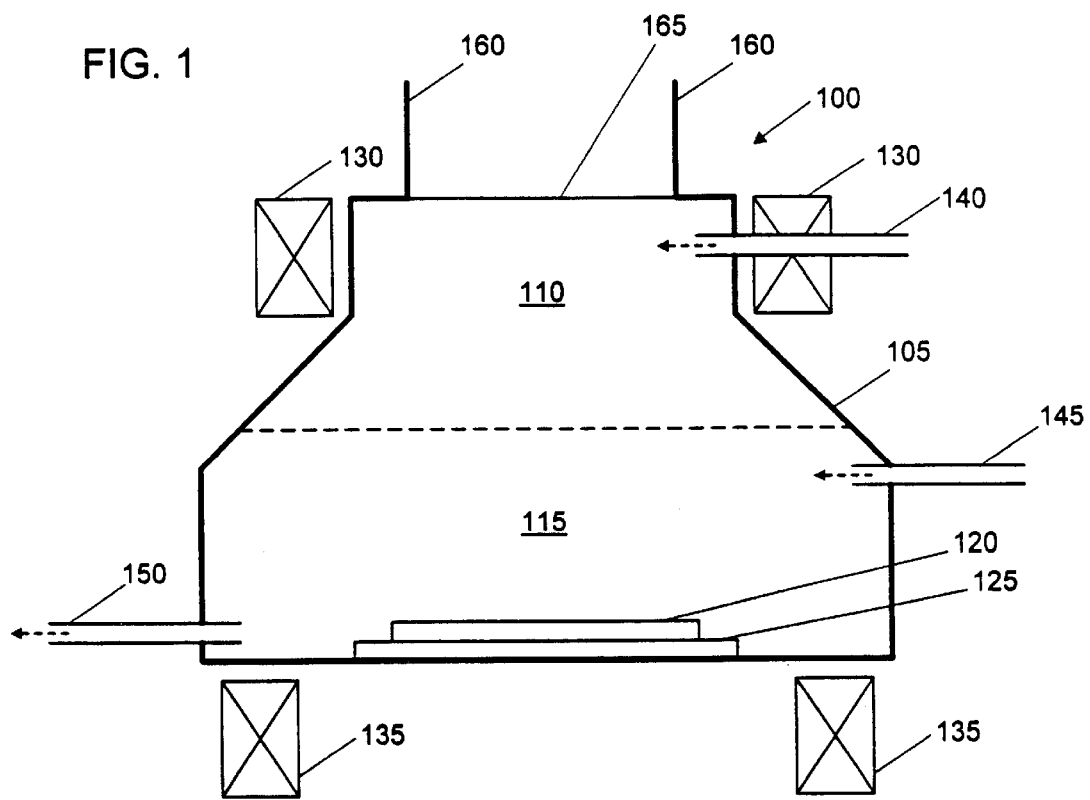
FIG. 1 is a cross-sectional view of a plasma reactor used to deposit a dielectric material layer on a substrate in accordance a preferred embodiment.

Embodiments of the invention include a material layer which, when used in the manufacture of an integrated circuit, has desirable properties that make it compatible with a number of manufacturing processes. The invention may be used in any integrated circuit manufacturing process where a thermally stable material layer with a high hardness and a high modulus is desired. However, the invention is particularly useful as a low-k dielectric layer for intralayer and interlayer electrical insulation of devices and metal lines in an integrated circuit. Use as an intralayer or interlayer dielectric will be the context in describing the invention, although the invention can be used as a material layer for a number of purposes, including, for example, use as a capping layer, a sacrificial layer, a global planarization layer, or a layer used in the damascene process.

Thin films of various materials are used in the manufacturing process to create an integrated circuit. These thin film layers are typically deposited using one of a number of processes based on chemical vapor deposition (CVD). These CVD-based methods result in thin films with a high purity of the desired material. In CVD processes, controlled chemical reactions of reactant gases, containing the materials to be deposited, take place on or near the surface of the substrate resulting in the formation of a solid thin film on the surface. The actual film-forming process is difficult to characterize because it involves a complicated combination of simultaneous surface reactions occurring along with heat and mass transfer.

CVD is typically performed as a batch process using a reaction chamber into which the semiconductor substrate is placed. Predetermined quantities of reactant gases and inert gases are introduced into the reaction chamber. Energy, typically thermal energy for basic CVD processes, is added to the chamber to drive the film-forming reactions. The byproducts of the reactions are continuously removed from the reaction chamber using a vacuum system. The use of thermal energy to drive the reactions results in high temperatures in the reaction chamber during deposition. Such high temperatures can damages devices and metal interconnect layers already deposited on the semiconductor substrate.

Plasma enhanced CVD (PECVD) is an improved type of CVD process which uses plasma, a partially ionized gas, as a nonthermal energy source to drive film-forming reactions at lower temperatures. The plasma is created by applying an electric field to a gas. The electric field accelerates the gas molecules to such a degree that their kinetic energy is sufficient to split each molecule into an ion and an electron. These electrons collide with more gas molecules, further ionizing the gas. Plasmas used in PECVD typically have electron densities in the range of $10^8$ and $10^{13}$ electrons per cubic centimeter.

An example of a simple type of PECVD reactor is the parallel-plate reactor. In a parallel-plate reactor, the plasma is formed between two electrodes. An electrical power source creates a potential, or bias, between the two electrodes. The substrate onto which the thin film will be deposited is typically mounted onto a chuck attached to one electrode. The other electrode is located above the surface of the substrate so that the plasma is formed above the film to be deposited. The upper electrode is often connected to the wall of the reaction chamber to increase the area of the electrode. The reaction chamber is typically grounded for safety reasons. Any electrical power source can be used to induce the plasma. However, because PECVD systems are usually used to deposit thin films of insulating materials, PECVD systems typically use plasma-inducing power sources in the radio frequency (RF) range.

In PECVD, the plasma performs two important functions. First, the electrons in the plasma collide with the molecules of the reactant gas, dissociating and ionizing these molecules. These electron collisions provide the energy needed to drive chemical reactions that are normally thermally activated. The use of plasma as an energy source allows for the creation of highly reactive chemical species at lower temperatures. This is especially important in integrated circuit manufacturing because it allows for deposition of material layers on temperature sensitive surfaces.

Second, the ions and other particles that make up the plasma physically bombard the surface during deposition. This ion bombardment imparts energy to the surface that alters the surface chemistry during deposition, providing new reaction pathways that further promote the film-forming chemical reactions. Properly controlled ion bombardment of the film improves film quality, resulting in films with higher hardness and modulus values. However, excessive ion bombardment can cause sputtering of the deposited material, degrading the quality of the film.

Improvements in PECVD have focused on controlling ion bombardment of the film surface and increasing plasma density. Increasing the density of the plasma improves the rate at which the deposition process occurs. High-density plasma (HDP) reactors, using plasmas with densities of greater than $10^{11}$ charged particles per cubic centimeter, use higher power energy sources to increase plasma density while confining the plasma in a region above the substrate. Confining the plasma in this manner allows for controlled ion bombardment of the thin film surface during deposition. Although highly energized, the ions near the substrate have a lower kinetic energy. These ions gently bombard the substrate surface without causing excessive sputtering of the deposited material.

In some HDP reactors, a magnetic field is typically used to confine the plasma in a region above the surface of the substrate while using a high power energy source, in the range of 0 to 5 kilowatts (kW), to excite the plasma. This high power energy source is separate from any RF biasing applied to the substrate to improve deposition. This power separation allows independent control of the ion bombardment of the surface and the biasing of the substrate.

A number of types of HDP reactors use magnetic fields to confine the plasma. An electron cyclotron resonance (ECR) reactor will be used in describing the invention, although other types of HDP reactors can be used to deposit the material layer. These other reactors could include, for example, inductively coupled plasma reactors, helicon reactors, and helical resonators. In ECR reactors, the plasma region is surrounded with magnets, comprising either permanent magnets or electromagnetic coils, to confine the plasma above the substrate. ECR reactors use a high-frequency microwave energy source. to excite the plasma and an RF-biased substrate to improve film deposition.

FIG. 1 is a cross-sectional view of ECR reactor 100 used to deposit a material layer on a substrate in accordance with one embodiment of the present invention. ECR reactor 100 includes vacuum chamber 105 comprising a material strong enough to maintain its shape when evacuated to a low vacuum. Vacuum chamber 105 preferably comprises a material having a low reactivity with the chemical species introduced into the chamber and any chemical species created by reactions within the chamber. A cooling system, not shown, may be used to control the temperature in vacuum chamber 105 during deposition.

Vacuum chamber 105 is divided into two conceptual regions, a plasma region 110 near the top of the chamber and a reaction region 115 near the base of the chamber. Plasma region need not necessarily be located above reaction region 115. Plasma region 110 could be located below or to the side of reaction region 115, as long as the two regions are contiguous. The overall shape of vacuum chamber 105 may be varied by those skilled in the art without ECR reactor 100 losing its beneficial geometric properties.

A substrate 120 is mounted on a chuck 125 near the base of vacuum chamber 105 within reaction region 115. Substrate 120 may comprise a silicon wafer or another semiconductor substrate material. Any number of devices, metal interconnect lines, and other material layers may have previously been deposited onto the surfaces of substrate 120. An electrostatic energy source or a vacuum, not shown, may be applied to chuck 125 to improve adherence of substrate 120 to chuck 125. Chuck 125 may contain an integrated heating or cooling system, not shown, to control the temperature of the substrate.

Vacuum chamber 105 is sealed and evacuated using a vacuum system, not shown, attached to vacuum outlet 150. A controlled flow of plasma gas is introduced through plasma gas inlet 140 into plasma region 110 near the top of vacuum chamber 105. Commercially available gas-line filters, not shown, may be used to remove any moisture from the plasma gas prior to introduction into plasma region 110. ECR magnets 130, comprising either permanent magnets or electromagnetic coils, surround vacuum chamber 105 in the vicinity of plasma region 110. There may be additional field-shaping auxiliary magnets 135 located near the base of vacuum chamber 105.

The plasma is excited by applying microwave power in the range of 0 to 5 kW, typically generated by a 2 to 5 gigahertz (GHz) magnetron source, to the flowing plasma gas through a microwave window 165. In the illustrative embodiment, a frequency of approximately 2.45 GHz is used. Microwave window 165 is comprised of a material transparent to microwave energy, typically quartz. The microwave energy may be carried to the microwave window 165 by rectangular waveguides 160. ECR magnets 130 create magnetic lines of flux within vacuum chamber 105 in the area of plasma region 110. These magnetic lines of flux help to confine the plasma within plasma region 110 and also create the magnetic field necessary to trigger the ECR phenomenon.

The ECR phenomenon dramatically increases the ion density of the plasma. Briefly, ECR is triggered by adding microwave energy to the plasma electrons in the presence of a perpendicular magnetic field in such a way that the microwave frequency is in resonance with the electron cyclotron frequency. The microwaves cause the electrons to move in circular orbits, called electron resonance. The perpendicular magnetic field changes the direction of the electrons' velocity vectors. By changing the electron velocity vectors, ECR increases the frequency of electron collisions. Between collisions, the ECR phenomenon continuously accelerates the electrons resulting in more collisions that further increase the ion density of the plasma.

A biased RF field, typically in the range of 0 to 2.5 kW and created by an RF generator operating at approximately 13.56 megahertz (MHz), may be applied to substrate 120 via chuck 125. Biasing the substrate tends to improve the overall deposition, especially by promoting gap filling between any metal lines and devices on the substrate surface. By using separate energy sources for plasma excitation and substrate biasing, greater control of the deposition is achieved.

A controlled flow of reactant gases is introduced into reaction region 115 through reactant gas inlet 145. Commercially available gas-line filters, not shown, may be used to remove any moisture from the reactant gases prior to introduction into reaction region 115. The electrons in the plasma collide with the molecules of the reactant gases, dissociating and ionizing these molecules into highly reactive species. These species react with one another and with the surface of substrate 120 to form a thin film while the plasma ions gently bombard the film surface as it is deposited. Once a thin film of the desired thickness, typically 1 $\mu$m, has been deposited, ECR reactor 100 is shut down by stopping the gas flows, turning off the microwave and any RF power supplies. Substrate 120 can then be removed from vacuum chamber 105. Empty vacuum chamber 105 may then be cleaned by operating the reactor while generating a highly reactive plasma, such as, for example, an oxygen plasma.

If the deposited thin film material layer has loosely bonded volatile species embedded in it, i.e., has a low thermal stability, an annealing process step may be necessary. Generally, a material with a low thermal stability will degrade or break apart completely if the temperature exceeds a critical temperature. Annealing typically "stabilizes" the material by driving off the loosely bonded materials during the anneal. If not annealed, these films may degrade or volatilize harmful substances during subsequent high temperature processing steps. To make such a dielectric thin film thermally stable, the substrate on which the film was deposited is typically placed into an oven and annealed at 400–425° C. for approximately 2 hours or until the film stops outgassing harmful substances.

Figure 2:
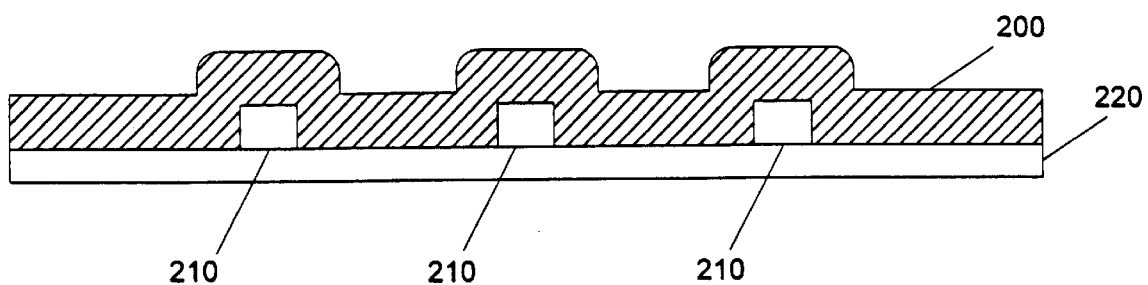
FIG. 2 is a cross-sectional view of a substrate containing a number of devices over which a dielectric material layer is deposited.

FIG. 2 is a cross-sectional view of a dielectric material layer 200 after it has been deposited on a substrate 220. Substrate 220 may comprise a silicon wafer or another semiconductor substrate material. Any number of devices 210, including transistors, capacitors, resistors, and their interconnecting metal lines, may have previously been deposited onto the surface of substrate 220.

Dielectric material layers of particular interest are amorphous fluorocarbon ($C_xF_y$) thin film materials. $C_xF_y$ materials, typically having dielectric constants in the range of 1.9 to 3.0, look promising for use as low-k ILD layers to replace relatively high-k $SiO_2$. The strong carbon-fluorine (C—F) bonds in $C_xF_y$ thin films decrease the dielectric constant. Increasing the fluorine to carbon ratio of the film decreases the dielectric constant, but also decreases the already low thermal stability of the film by reducing its amorphous carbon-carbon (C—C) crosslinked structure.

While having desirably low dielectric constants, the thermal stability of $C_xF_y$ materials is much lower than the thermal stability of previously used oxides such as $SiO_2$. The problem of low thermal stability has precluded the use of $C_xF_y$ materials as a low-k ILD in integrated circuit manufacturing. During the manufacture of integrated circuits, process temperatures in excess of 400° C. are often reached. At these high process temperatures, $C_xF_y$ materials decompose into highly corrosive fluorine species such as F, CF, $CF_2$, and $CF_3$. These fluorine species can outgas and corrode any metal interconnect layers covered by the $C_xF_y$ ILD or deposited on top of the $C_xF_y$ ILD. Outgassing may also cause adhesion problems between adjacent ILD layers. These corrosion and adhesion problems may result in yield and reliability problems in the integrated circuits being manufactured.

$C_xF_y$ materials are typically deposited using HDP reactors because they produce high purity thin films at low deposition temperatures and fast deposition rates. Thin films deposited with HDP reactors are typically more stable than those deposited with conventional parallel plate PECVD reactors. The use of an ECR reactor is currently preferred because it allows a high degree of control of the ion bombardment of the deposited material. Although other types of HDP reactors can be used to practice the invention, ECR reactor 100 (see FIG. 1) will be used to describe the deposition of a $C_xF_y$ ILD. Argon is the most common plasma gas. $C_xF_y$ reactant gases typically comprise a mixture of a fluorocarbon and a hydrocarbon. The fluorocarbon may include $C_4F_8$, $C_5F_8$, or $C_6F_6$. The hydrocarbon may include $CH_4$, $C_2H_4$, $C_2H_2$, and $C_2H_6$.

$C_xF_y$ ILD films deposited with these combinations of gases are thermally unstable and require annealing at 400 to 425° C. for up to two hours for stabilization prior to other high-temperature manufacturing steps. These films also have hardness and modulus values approximately 18 to 20 times lower than $SiO_2$. Low hardness and low modulus values limit the use of $C_xF_y$ materials as ILD layers. An ILD needs to have a high hardness so that it will be able to withstand chemical-mechanical planarization. When applying an ILD it is desirable to create a level, planar, uniform surface so as to facilitate the deposition of subsequent metal interconnect layers and additional ILD layers.

While current $C_xF_y$ materials have been used as intralayer dielectrics, this use requires an additional process step consisting of the deposition of capping layers on top of the $C_xF_y$ materials. Capping layers allow for chemical-mechanical planarization between interconnect layers. However, capping layers typically have relatively high dielectric constants that result in increased parasitic capacitance between interconnect layers.

An ILD needs to have a high modulus, or stiffness, so that it has the structural strength to support additional layers deposited on top of it. Even when using capping layers for protection, current $C_xF_y$ materials do not have the structural strength to support multiple interconnect layers. High hardness and modulus values also allow for via formation through the ILD between adjacent interconnect layers.

Using helium (He) instead of argon (Ar) as the plasma gas in ECR reactor 100 when depositing $C_xF_y$ materials results in thin films with improved thermal stability and higher hardness and modulus values. Excited He ions have a higher photon energy (excitation energy of −23 eV) than Ar ions (excitation energy of −14 eV). The higher photon energies from the excited He ions desorb the volatile species from the $C_xF_y$ films during the deposition process. These desorbed volatile species are then removed by the vacuum system. The lighter He ions, having a mass approximately nine times lower than the mass of Ar, gently bombards the surface of the deposited film during deposition without sputtering the surface as much as Ar ions.

In one embodiment of the invention, dielectric material layer 200, in this case a $C_xF_y$ thin film, is deposited on substrate 220 using ECR reactor 100. Devices 210 may have been previously deposited on the surface of substrate 220. Vacuum chamber 105 is evacuated to a pressure in the range of approximately 1 to 1000 millitorr (mTorr). A controlled flow of He gas, with a flow rate in the range of approximately of 125 to 175 standard cubic centimeters per minute (SCCM), is introduced through plasma gas inlet 140 into plasma region 110. In this embodiment, the flow rate of He gas is approximately 150 SCCM. The plasma is excited by applying approximately 2.7 kW of microwave power to the He gas. The flow rate of the He gas may be adjusted to stabilize the plasma. A RF bias of approximately 1.5 kW is applied to substrate 220 via chuck 125.

A controlled flow of $C_xF_y$ reactant gases is introduced into reaction region 115 through reactant gas inlet 145. In this embodiment, $C_xF_y$ reactant gases are $C_4F_8$ and $C_2H_4$ flowing at approximately 40 and 30 SCCM, respectively. This mixture of reactant gases results in the deposited film having a fluorine concentration in the range of 30 to 40% and a dielectric constant of approximately 2.5. The temperature of substrate 220 is maintained at a temperature in the range of approximately 350 to 450° C. during the deposition. In this embodiment, the temperature of substrate 220 is maintained at approximately 400° C. These reaction parameters result in a film deposition rate of approximately 3000 angstroms per minute. When a film of the desired thickness is achieved, the microwave power, the RF power, and the reactant and plasma gas flows are shut down. Films are typically deposited to a thickness in the range of approximately 0.5 to 2 μm.

Figure 3:
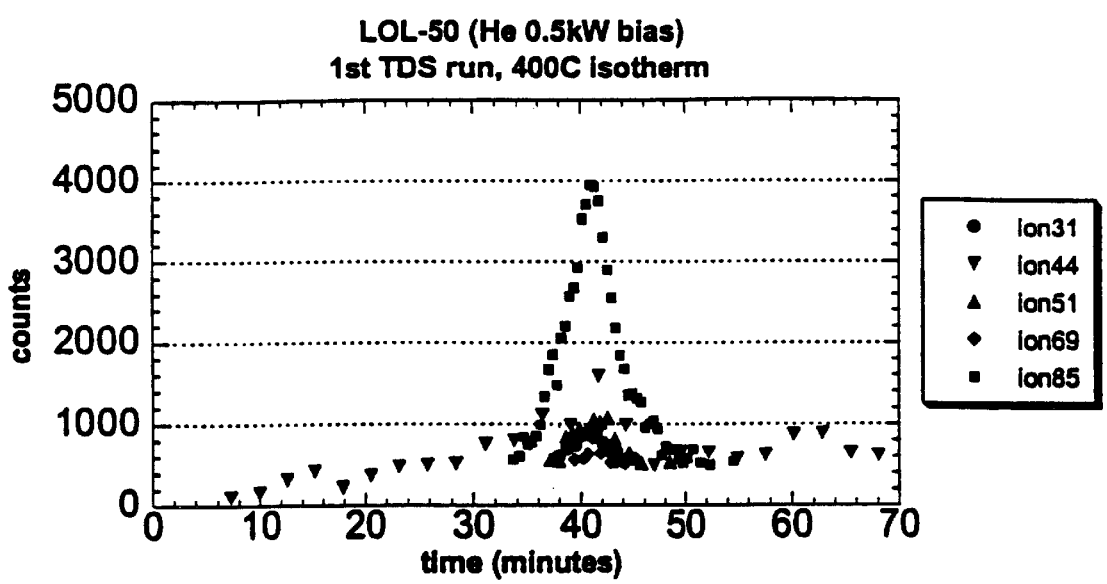
FIG. 3 is a graph of the thermal desorption spectra of a $C_xF_y$ ILD layer, deposited in a plasma reactor using helium as the plasma gas, during an anneal showing that the layer outgassed undesirable fluorine species for less than a 20 minute period.
Figure 4:
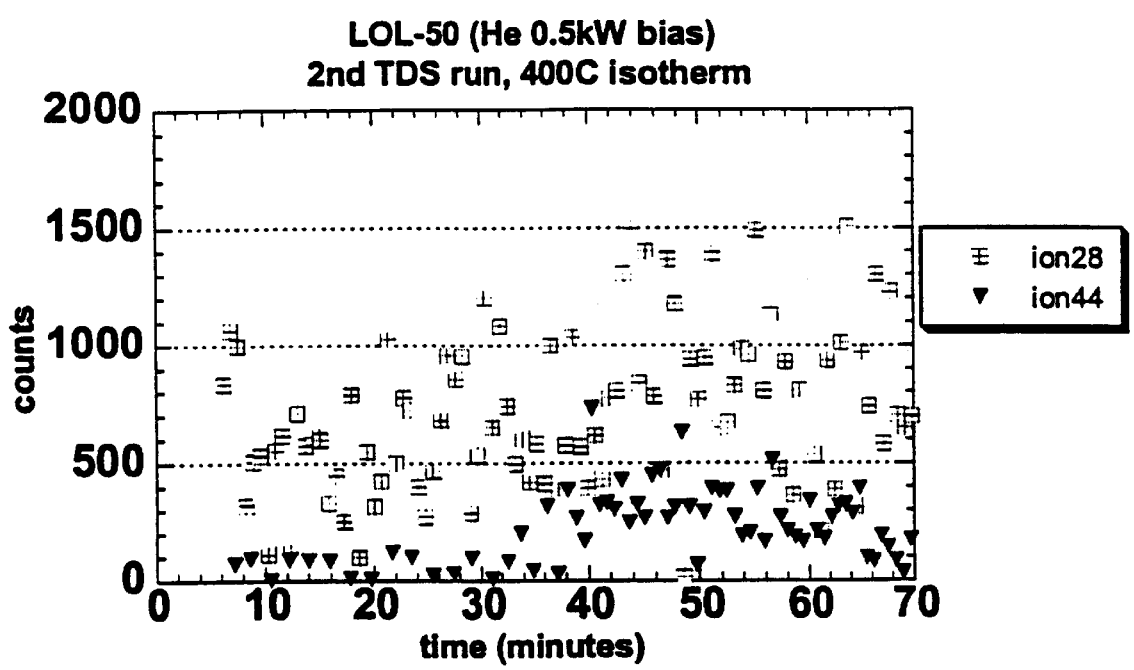
FIG. 4 is a graph of the thermal desorption spectra of a second anneal of the $C_xF_y$ ILD layer of FIG. 3 showing no further outgassing of fluorine species, demonstrating that the film is thermally stable.

As shown in the graph of FIG. 3, the resulting $C_xF_y$ ILD film has a high thermal stability. When the film was annealed in an oven at 400° C., the film outgassed undesirable fluorine species, as detected as $SiF_3$ (ion 85) on the thermal desorption spectra, for less than a 20 minute period. On the graph, this can be seen as a peak starting at approximately 34 minutes into the anneal and ending at approximately 50 minutes into the anneal. As shown in the graph of FIG. 4, a second anneal of the same film at the same temperature shows no further outgassing of fluorine species, demonstrating that the film is thermally stable. This 20 minute annealing period is an improvement over the 2 hour anneal required for comparable films deposited using Ar as the plasma gas. It is foreseeable that one skilled in the art with the benefit of this disclosure could deposit a film with a thermal stability high enough such that annealing is unnecessary.

Figure 5:
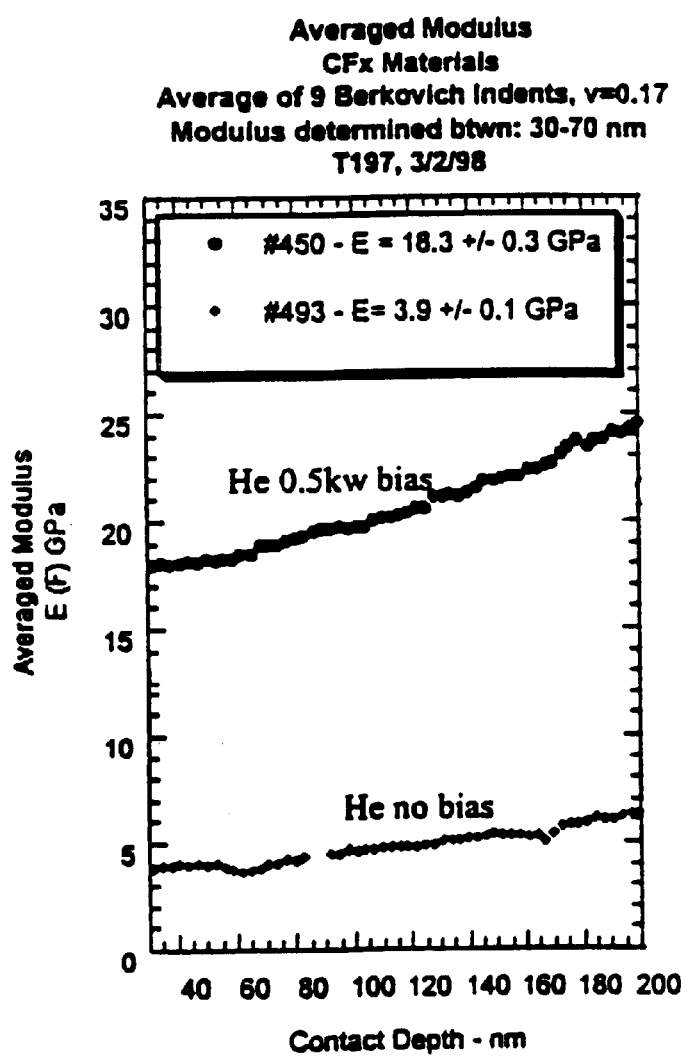
FIG. 5 is a graph showing the averaged modulus of a $C_xF_y$ ILD layer deposited in plasma reactor using helium as the plasma gas.
Figure 6:
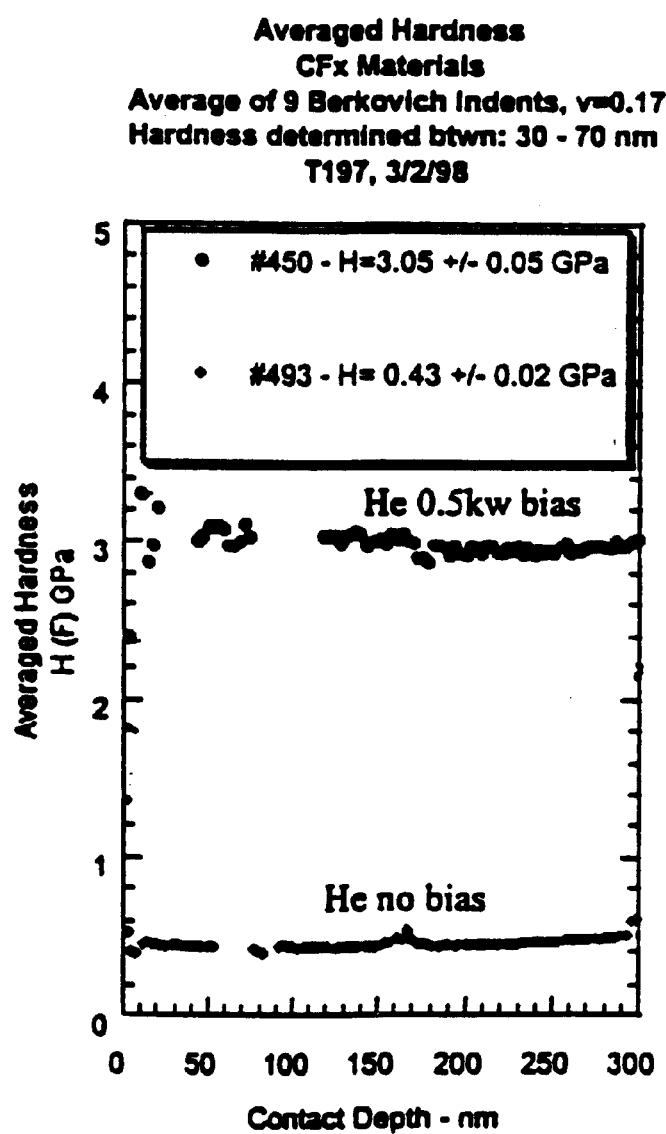
FIG. 6 is a graph showing the averaged hardness of a $C_xF_y$ ILD layer deposited in a plasma reactor using helium as the plasma gas.

As shown in the graph of FIG. 5, the resulting $C_xF_y$ ILD has an averaged modulus (E) of 18.3±0.3 gigapascals (GPa), which is approximately five times the modulus of $C_xF_y$ films deposited using Ar as the plasma gas. It is foreseeable that one skilled in the art with the benefit of this disclosure could deposit an $C_xF_y$ ILD with a modulus in the range of approximately 15 to 500 GPa. The resulting $C_xF_y$ ILD has an averaged hardness (H) of 3.05±0.05 GPa, as shown in the graph of FIG. 6. This hardness is approximately five times the hardness of $C_xF_y$ films deposited using Ar as the plasma gas. It is foreseeable that one skilled in the art with the benefit of this disclosure could deposit an $C_xF_y$ ILD with a hardness in the range of 0.5 to 40 GPa.

Figure 7:
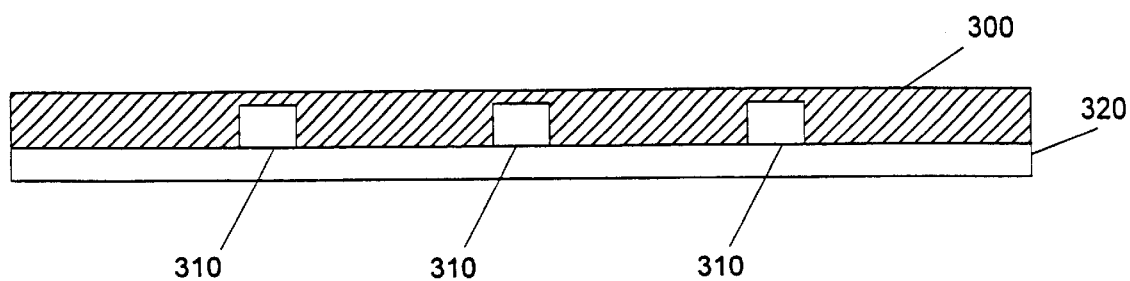
FIG. 7 is a cross-sectional view of a $C_xF_y$ ILD layer deposited, in a plasma reactor using helium as the plasma gas, over the interconnect layer of a substrate and planarized using chemical-mechanical planarization.

FIG. 7 is a cross-sectional view of a $C_xF_y$ ILD layer 300 after it has been deposited on a substrate 320. Substrate 320 may comprise a silicon wafer or another semiconductor substrate material. Devices 310, possibly including transistors, capacitors, resistors, and their interconnecting metal lines, have previously been on the surface of substrate 320. The surface of $C_xF_y$ ILD layer 300 has been planarized using chemical-mechanical planarization.

Figure 8:
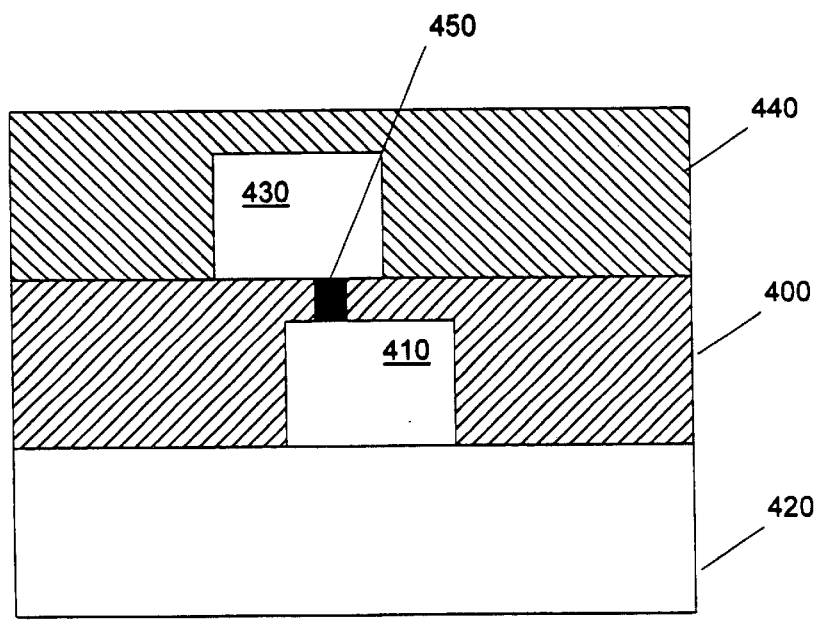
FIG. 8 is a partial cross-sectional view of the $C_xF_y$ ILD layer of FIG. 7 after an additional interconnect layer and a material layer are deposited and a via formed between the two interconnect layers.

FIG. 8 is a partial cross-sectional view of a $C_xF_y$ ILD layer 400, formed in the same manner as $C_xF_y$ ILD layer 300 described above. $C_xF_y$ ILD layer 400 is deposited on substrate 420 onto which an interconnect layer, represented by metal interconnect line 410, has previously been deposited. An additional interconnect layer, represented by metal interconnect line 430, is deposited on top of $C_xF_y$ ILD layer 400. If a carbon-based resist is used in the deposition of the additional interconnect layer, it may be necessary to deposit a sacrificial layer, not shown, on top of $C_xF_y$ ILD layer 400. Material layer 440 is deposited on top of metal interconnect line 430 and $C_xF_y$ ILD layer 400. Alternatively, material layer 440 could be deposited first and the additional interconnect layer, as represented by metal interconnect line 430, formed in trenches etched into material layer 440.

Excess fluorine in the $C_xF_y$ material may cause interlayer adhesion problems. Therefore, there may be a liner layer, not shown, between material layer 440 and $C_xF_y$ ILD layer 400 to improve the adhesion between these two layers. Material layer 440 may be a $C_xF_y$ ILD layer or another type of ILD material. Via 450, a vertical opening filled with a conducting material, is formed through $C_xF_y$ ILD layer 400 connecting metal interconnect line 410 to metal interconnect line 430. The deposition of additional capping layers, not shown, may be desirable to prevent any moisture absorption into $C_xF_y$ materials.

Figure 9:
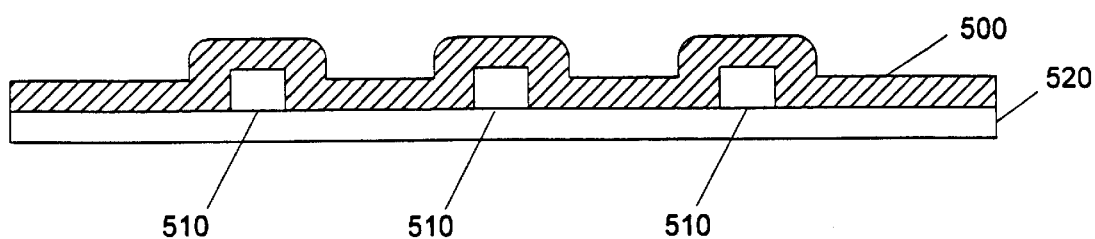
FIG. 9 is a cross-sectional view of a $C_xF_y$ layer deposited, in a plasma reactor using helium as the plasma gas, over the interconnect layer of a substrate.
Figure 10:
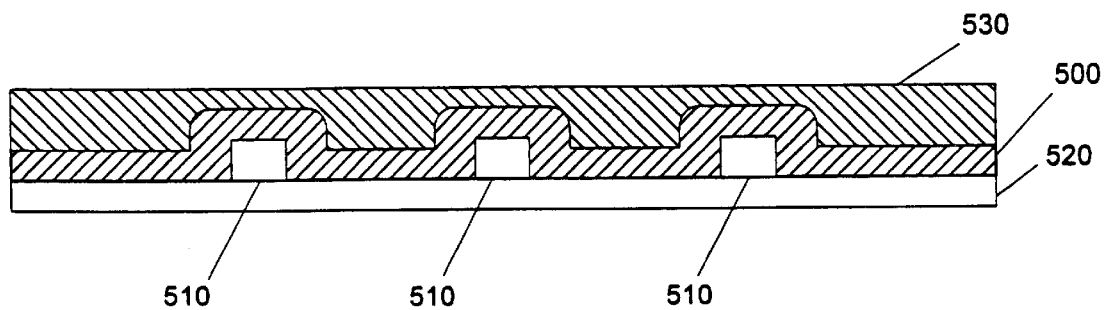
FIG. 10 is a cross-sectional view of the $C_xF_y$ layer of FIG. 9 after a material layer is deposited and planarized using chemical-mechanical planarization.

FIG. 9 shows a cross-sectional view of a $C_xF_y$ layer 500 deposited, using an plasma reactor with helium as the plasma gas, over the interconnect layer 510 of a substrate 520 for use as an intralayer dielectric layer. FIG. 10 shows a cross-sectional view of the $C_xF_y$ layer 500 of FIG. 9 after a material layer 530 is deposited and planarized using chemical-mechanical planarization. Material layer 530 may comprise the same or a similar material as $C_xF_y$ layer 500, or may comprise a different material.

As described in the foregoing, the embodiments of the present invention provide a solution to the need for a low-k ILD material with a dielectric constant less than that of $SiO_2$, a high hardness, a high modulus, and a high thermal stability. The invention is particularly useful as a low-k dielectric layer for intralayer and interlayer electrical insulation of devices and metal lines in an integrated circuit. While the invention has been described with reference to the structures and methods disclosed herein, it is not confined to the details set forth; rather, the invention is defined by the scope of the following claims.

I claim:

1. A semiconductor integrated circuit comprising:
    a substrate, the substrate having a surface;
    a first interconnect layer deposited on the surface;
    a first dielectric layer deposited over the first interconnect layer, wherein the first dielectric layer has a hardness in the range of 0.5 to 40 GPa, a modulus in the range of 15 to 500 GPa, a high thermal stability, and a dielectric constant in the range of 1.9 to 3.0.

2. The semiconductor integrated circuit of claim 1, further comprising:
    a second interconnect layer deposited on the first dielectric layer;
    a second dielectric layer deposited on the second interconnect layer; and
    a via connecting the first interconnect layer to the second interconnect layer through the first dielectric layer.

3. The semiconductor integrated circuit of claim 2, wherein the second dielectric layer has a hardness in the range of 0.5 to 40 GPa, a modulus in the range of 15 to 500 GPa, a high thermal stability, and a dielectric constant in the range of 1.9 to 3.0.

4. The semiconductor integrated circuit of claim 1, wherein a material layer is deposited on the first dielectric layer.

5. The semiconductor integrated circuit of claim 4, wherein the material layer is a second dielectric layer with a hardness in the range of 0.5 to 40 GPa, a modulus in the range of 15 to 500 GPa, a high thermal stability, and a dielectric constant in the range of 1.9 to 3.0.

6. The semiconductor integrated circuit of claim 1 wherein the first dielectric layer is $C_xF_y$.

7. The semiconductor integrated circuit of claim 6 wherein x and y are integers.

8. The semiconductor integrated circuit of claim 7 wherein $C_xF_y$ is selected from the group consisting of CF, $CF_2$, and $CF_3$.

* * * * *